United States Patent [19]

Staring

[11] Patent Number: 4,965,222

[45] Date of Patent: Oct. 23, 1990

[54] METHOD OF MANUFACTURING AN EPITAXIAL INDIUM PHOSPHIDE LAYER ON A SUBSTRATE SURFACE

[75] Inventor: Aemilianus G. J. Staring, Eindhoven, Netherlands

[73] Assignee: U.S. Philips Corporation, New York, N.Y.

[21] Appl. No.: 416,182

[22] Filed: Oct. 2, 1989

[30] Foreign Application Priority Data

Oct. 7, 1988 [NL] Netherlands .................... 8802458

[51] Int. Cl.$^5$ .......................................... H01L 21/20
[52] U.S. Cl. ............................ 437/81; 148/DIG. 110; 148/DIG. 119; 156/613; 437/88
[58] Field of Search ............... 148/DIG. 65, 110, 119, 148/169; 156/610–614; 427/248.1, 252, 255.1; 437/81, 88, 105, 107, 971, 96, 949

[56] References Cited

U.S. PATENT DOCUMENTS

| | | | |
|---|---|---|---|
| 4,716,130 | 12/1987 | Johnston, Jr. et al. | 437/104 |
| 4,720,560 | 1/1988 | Hui et al. | 556/1 |
| 4,734,514 | 3/1988 | Melas et al. | 556/70 |
| 4,764,439 | 8/1988 | Gibbons et al. | 429/111 |
| 4,782,034 | 11/1988 | Dentai et al. | 437/94 |
| 4,801,439 | 1/1989 | Blum et al. | 423/284 |
| 4,847,399 | 7/1989 | Hallode et al. | 556/1 |
| 4,916,828 | 4/1990 | Yamane et al. | 422/306 |
| 4,981,979 | 11/1989 | Lewis | 136/201 |

FOREIGN PATENT DOCUMENTS

0245214 12/1985 Japan .
1094613 4/1989 Japan .

OTHER PUBLICATIONS

Staring et al., "Oganometallic Vapor Phase Epitoxy . . . Using . . . Methylcyclo-Bentadienylindium," J. Am. Soc., 111(19), 1989, pp. 7648–7650.

Aylett et al., " . . . Metaalorganic Precursors to III–V Compounds," Mat. Res. Soc. Symp., vol. 17, 1983, pp. 177–182.

Peppe et al., "A Simple Synthesis of Cyclopentadienylindium", J. Chem. Soc., Dalton Trans., 1981, p. 2592.

Long et al., " . . . Growth of Semi-Insulating InP by MOCVD", J. Crys. Growth, vol. 77, Nos. 1–3, Sep. 1986, pp. 42–46.

Primary Examiner—Olik Chaudhuri
Assistant Examiner—William Bunch
Attorney, Agent, or Firm—Norman N. Spain

[57] ABSTRACT

A method of manufacturing an epitaxial InP layer on a substrate surface by means of a MOVPE process at atmospheric pressure, cyclopentadienyl indium (I) or alkyl cyclopentadienyl indium (I) being used as the indium precursor, thereby precluding side reactions.

4 Claims, 1 Drawing Sheet

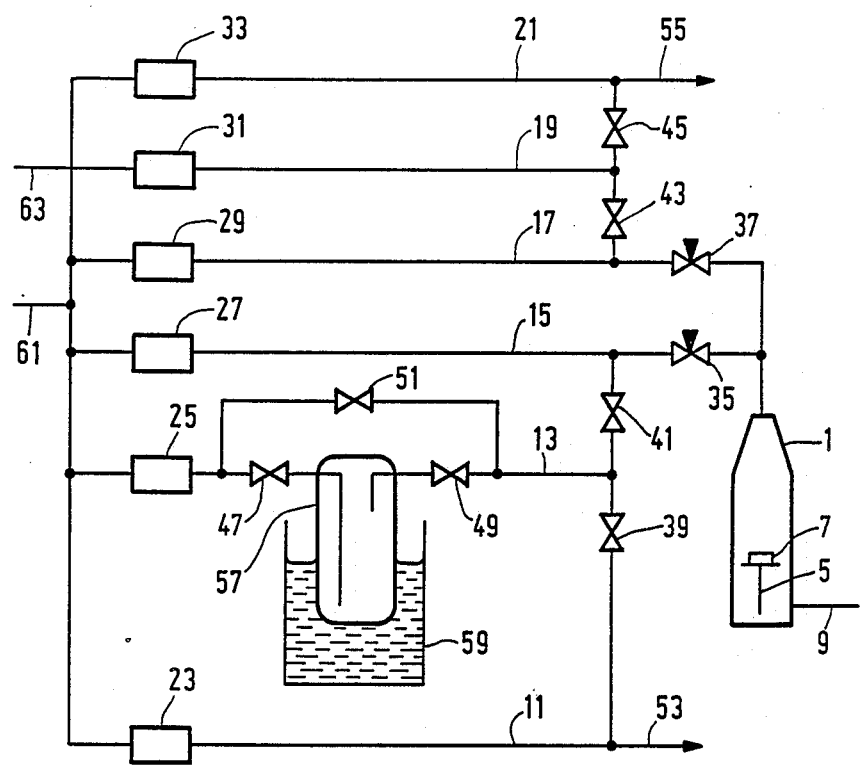

METHOD OF MANUFACTURING AN EPITAXIAL INDIUM PHOSPHIDE LAYER ON A SUBSTRATE SURFACE

BACKGROUND OF THE INVENTION

The invention relates to a method of providing an epitaxial indium phosphide layer on a substrate surface by bringing a gas mixture comprising a metalorganic indium compound and phosphine into contact with the heated substrate surface.

Such indium phosphide layers (InP layers) are used in optoelectronic components such as solid-state lasers, light-emitting diodes (LEDs), photodetectors and electronic components such as high-frequency field effect transistors. Processes for applying such layers from the vapour phase, in which metalorganic indium compounds are used are referred to in literature as MOCVD processes (MOCVD=metalorganic chemical vapour deposition) or OMCVD (OMCVD=organometallic chemical vapour deposition). If epitaxial layers are provided by means of such a method, this is commonly referred to as MOVPE-processes (MOVPE=metalorganic vapour phase epitaxy). In order to apply an InP layer to a substrate by means of a MOVPE process, a carrier gas (for example $H_2$) is conducted over a suitable metalorganic indium compound such as, for example, trimethyl indium (($CH_3$)$_3$In), in which the ($CH_3$)$_3$In vapour is led over the heated substrate together with phosphine ($PH_3$), the following reaction taking place:

$$(CH_3)_3In + PH_3 \rightarrow InP + 3CH_4$$

Triethyl indium may alternatively be used instead of trimethyl indium. However, when the said indium reagents (precursors) are used, undesirable side reactions occur between the indium compounds and phosphine. These side reactions are caused by the Lewis acid character of the indium compounds on the one hand and the Lewis base character of phosphine on the other hand. A Lewis acid is an element or compound having an electron deficiency, as a consequence hereof it is an electron acceptor such as the trialkyl compounds of elements in group III of the periodic system to which In belongs. A Lewis base is an element or compound having an electron excess, as a consequence of which it is an electron donor such as the trialkyl compounds and hydrides of elements in group IV to which P belongs. Due to the Lewis acid and the Lewis base character, respectively, of the reagents used an adduct is formed:

$$(CH_3)_3In + PH_3 \rightarrow (CH_3)_3In-PH_3$$

The adduct formed decomposes spontaneously while splitting off methane molecules, resulting in a polymer compound being formed:

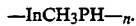

This polymer compound is non-volatile and is deposited from the vapour phase. The undesirable polymer formation takes place at room temperature, before the reagents can reach the heated substrate. This polymer formation causes deletion of reactants in the vapour phase, which leads to an irregular and low growth rate of the InP layer. Due to the deposition of the polymer carbon is incorporated in the growing layer, which adversely affects the desired luminescing and/or electronic properties of the InP layer. Moreover, the presence of the amorphous polymeric material on the growing InP surface disturbs the epitaxial crystal growth.

In European Patent Specification EP No. 52979, a method is described by means of which the above-said undesirable polymer formation is precluded. In accordance with the said method, firstly, an adduct of an indium compound, for example ($CH_3$)$_3$In, and a trialkyl phosphine, for example P($C_2H_5$)$_3$ is prepared. The adduct ($CH_3$)$_3$In—P($C_2H_5$)$_3$ is formed in a separate reaction space at a low temperature. Unlike the adducts of $PH_3$, an adduct thus formed is chemically stable and does not cause polymers to be formed. Subsequently, the adduct formed is mixed in a second space, an additional quantity of phosphine being used to prepare an InP layer on a substrate. To obtain a phosphor-containing layer, phosphine must be used because of the thermal stability of the triethyl phosphine group.

A disadvantage of the known method is the low vapour pressure of the adducts comprising trialkyl phosphines, which leads to a limitation of the growth rate of the InP layer. Moreover, the already complicated MOVPE process is rendered even more complicated.

SUMMARY OF THE INVENTION

It is an object of the invention, inter alia, to provide a method of the type mentioned in the opening paragraph, in which the above-stated drawbacks are obviated.

This object is achieved in accordance with the invention by a method as described in the opening paragraph, which is characterized in that cyclopentadienyl indium (I) is used as the metalorganic indium compound, the cyclopentadienyl group optionally being alkyl-substituted.

BRIEF DESCRIPTION OF THE DRAWING

The sole figure of the drawing is a diagrammatic view of a device for carrying out the method of the invention.

DETAILED DESCRIPTION OF THE INVENTION

Cyclopentadienyl indium (I), In($C_5H_5$), is a "half-sandwich" compound of indium and has been described for the first time in an article by E. O. Fisher and H. P. Hofmann in Angew. Chem. (1957), 69, 639. In this compound, the valence shell of indium is completely occupied by 18 electrons. This compound has no empty electron orbitals and, consequently, no Lewis acid properties. This means that this compound in combination with phosphines does not form an adduct which could lead to the formation of undesirable polymers. ($C_5H_5$)In is a yellowish, solid substance having a melting point of approximately 176° C. The vapour pressure at 20° C. is 0.12 mbar and at 40° C. 0.36 mbar. In general, alkyl substitution of the cyclopentadiene ring leads to a decrease of the melting point. For example, ethyl cyclopentadienyl indium (I), ($C_5H_4$.$C_2H_5$)In, is a liquid at room temperature. In general, the vapour pressure of the alkyl-substituted ($C_5H_5$). In compounds is higher than that of the unsubstituted compounds, which is advantageous to the MOVPE process. The vapour pressure of ethyl cyclopentadienyl indium (I) is 0.28 mbar at 22° C. and 0.51 mbar at 40° C. When the above-said cyclopentadienyl indium (I) compounds are made to react with $PH_3$ at a heated substrate surface, an InP layer is formed. If a single crystal of, for example, InP or Si is used as a substrate, the InP layer formed is epitaxial. Due to the fact that the Lewis acid properties are absent in the said indium compounds no adducts and/or polymers are formed. This means that the InP layer exhibits a regular growth and that no carbon is incorporated.

An embodiment of the method in accordance with the invention is characterized in that the vapour pressure of the alkyl-substituted cyclopentadienyl indium (I) ranges between 0.01 and 130 mbar in the temperature range between 0° and 100° C. This is a practical pressure range for carrying out MOVPE processes. Vapour pressures below 0.01 mbar lead to uneconomically long deposition times, and vapour pressures exceeding 130 mbar lead to an uncontrollable deposition rate.

An additional embodiment of the method in accordance with the invention is characterized in that monoalkyl-cyclopentadienyl indium (I) is used, in which the number of carbon atoms of the alkyl group is maximally 4. If the cyclopentadiene ring has one alkyl group, the alkyl group being a methyl, ethyl, propyl or butyl group, the vapour pressure of the relevant indium compound is in the vapour-pressure range of from 0.01 to 130 mbar.

A preferred embodiment of the method in accordance with the invention is characterized in that methyl cyclopentadienyl indium (I) is used. This indium compound is a solid substance and has a vapour pressure of 0.4 mbar at 20° C. and of 2.1 mbar at 42° C.

Monocrystalline substrates of Si, Ge, GaP, GaAs, AlAs, $Al_2O_3$, InP, $InAs_xP_{1-x}$, $In_xGa_{1-x}As_yP_{1-y}$, wherein x and y have a value between 0 and 1, may be used for the manufacture of epitaxial InP layers. The materials may be doped or undoped. The substrate may alternatively be composed of layers of the above-said materials.

In general, the temperature of the substrate is kept in the range of from 500°–800° C. The reaction takes place at atmospheric pressure. $H_2$ is generally used as the carrier gas. Besides the In and P-containing reactants, also other gases may be supplied to prepare doped InP. For p-type InP, for example, $SnCl_2$, $ZnCl_2$ or $Zn(CH_3)_2$ may be admixed. For n-type InP, for example, $H_2S$ or $TeCl_4$ may be admixed.

The thickness of the InP layer grown depends on the circumstances under which the reaction is carried out, such as the temperature of the substrate, the concentration of the reactants in the carrier gas, the flow rate of the carrier gas and the reaction time.

The invention will now be explained in more detail by means of the following exemplary embodiment and with reference to the accompanying drawing, in which the drawing is a diagrammatic representation of a device for carrying out the method in accordance with the invention.

EXAMPLE

Cyclopentadienyl indium (I) is prepared in accordance with the method described by C. Peppe, D. G. Tuck and L. Victoriano in J. Chem. Soc., Dalton Trans., 1981, p. 2592. In accordance with this method, methyl lithium (Merck) is made to react with cyclopentadiene (Janssen chimica) to form lithium cyclopentadienide, in accordance with the reaction equation:

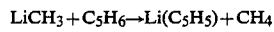

Lithium cyclopentadienide is further made to react with indium (I)-chloride to form cyclopentadienyl indium (I) in accordance with the reaction equation:

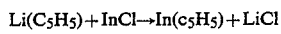

To prepare methyl cyclopentadienyl indium (I) and ethyl cyclopentadienyl indium (I) use is made of methyl cyclopentadiene and ethyl cyclopentadiene, respectively. Methyl cyclopentadiene is commercially available (Janssen Chimica). Ethyl cyclopentadiene and other monoalkyl-substituted cyclopentadiene compounds are prepared in accordance with the method described in Houben-Weyl, Methoden der organischen Chemie, vol. 5/1 c, 4th edition, p. 662. In this literature reference, cyclopentadiene is made to react with alkyl magnesium bromide, after which the reaction product formed is converted with dialkyl sulphate into alkyl cyclopentadiene. The MOVPE process of the invention is carried out by means of a device as diagrammatically shown in the drawing. The device is a standard arrangement for this type of processes. Reference numeral 1 denotes a quartz glass reactor of the so-called "hot wall" type. The reactor accommodates a molybdenum substrate holder 5 in which a thermocouple (not shown) is provided. The substrate holder is heated by means of a resistance heater (not shown). A semiconductive InP substrate 7 is located on the substrate holder. The substrate surface to be covered is tilted through 3° relative to the (100)-face in the direction of the (110)-face.

When this substrate surface is viewed on an atomic scale, it exhibits a "sawtooth" surface and enhances nucleation of the InP layer to be grown thereon. Previously the substrate is treated with acetone and to remove vapors, and subsequently rinsed with water. Subsequently, the substrate surface is etched in a mixture of $H_2SO_4$, $H_2O_2$ and $H_2O$ (5 parts by volume of 96 parts by weight of $H_2SO_4$, 1 part by volume of 30 parts by weight of $H_2O_2$, 1 part by volume of $H_2O$) and then rinsed in deionized water. The substrate is then dried by means of spinning.

The reactor is provided with a discharge pipe 9 and is connected to a gas-dosing system comprising a number of pipes 11, 13, 15, 17, 19 and 21; mass flow controllers 23, 25, 27, 29, 31 and 33, needle valves 35 and 37 and stop valves 39, 41, 43, 45, 47, 49 and 51. Pipes 15 and 17 are intended for a hydrogen flow to the reactor, the flow being controlled by the mass flow controllers 27 and 29. Pipe 19 is intended for a flow of a $PH_3/H_2$ mixture to the reactor, the flow being controlled by mass flow controller 31. Pipes 11 and 21 together with the mass flow controllers 23 and 33 are intended for flushing the gas-dosing system with hydrogen. By closing the needle valves 35 and 37, and opening the valves 43, 45, 41 and 39 the $H_2$ flow through pipes 15 and 17 can be adjusted without entering into the reactor.

The gas-dosing system further comprises vents 53 and 55. An evaporator vessel 57 containing methyl cyclopentadienyl indium (I) is arranged in series with pipe 13. Hydrogen can be led through the evaporator vessel, the flow being controlled by mass flow controller 25. The $H_2$/indium compound flow through pipe 13 can be adjusted by opening valve 39, valve 41 being closed, preventing the flow from entering the reactor. The evaporator vessel is accommodated in a thermostatically controlled bath 59 of 50° C. The pipes transporting the gaseous indium compound are kept at 60° C. by means of heating ribbon. Valves 47 and 49 are intended for disconnecting the evaporator vessel 57, valve 51 serving as a by-pass. $H_2$ which has been purified by means of a Pd diffusion cell is introduced into the system via pipe 61. A $PH_3/H_2$ mixture (10% by volume of $PH_3$ in $H_2$) which has been dried by means of "molecular sieves" is introduced into the system via pipe 63.

After evacuating and rinsing using $H_2$, $H_2$ and a $PH_3/H_2$ mixture are introduced into the reactor. The $H_2$ volume flow through pipes 15 and 17 is totally 1920 sccm (standard $cm^3$ per minute). The $PH_3/H_2$ flow through pipe 19 is 80 sccm. The molar fraction of $PH_3$ in the reactor then amounts to $4.10^{-3}$. The overall pressure in the reactor is maintained at 1 bar. Subsequently, the InP substrate is heated to 675° C.

Next, methyl cyclopentadienyl indium (I) vapour is led over the substrate by leading $H_2$ through the evaporator vessel 57 via the mass flow controller 25. Valves 47 and 49; pipe 13 and valves 41 and 35. The flow through this vessel is 100 sccm; the $PH_3/H_2$ flow is 80 sccm and the $H_2$ flow is 1820 sccm. The molar fractions of $PH_3$ and the indium compound in the reactor amount to $4.10^{-3}$ and $1.5.10^{-4}$, respectively. Under these circumstances, a growth rate of 1.5 $\mu$m of InP per hour is attained. An even InP layer having a glossy appearance is formed. The layer grown is of the n-type. The electron-mobility amounts to 3500 $cm^2/Vs$.

Although in the present Patent Application a description is given of the provision of a InP layer on a substrate, use being made of a cyclopentadienyl indium (I) precursor, it will be clear to those skilled in the art that the method can be applied to known processes for the manufacture of LEDs, solid-state lasers, detectors and HF-field effect transistors by replacing the present-state of-the-art In precursors, such as trimethyl indium and triethyl indium, by In precursors in accordance with the invention.

I claim:

1. A method of providing an epitaxial indium phosphide layer on a substrate surface by bringing a gas mixture comprising a metalorganic indium compound and phosphine into contact with the heated substrate surface, characterized in that cyclopentadienyl indium (I) is used as the metalorganic indium compound, the cyclopentadiene group optionally being alkyl-substituted.

2. A method as claimed in claim 1, characterized in that the vapour pressure of the alkyl-substituted cyclopentadienyl indium (I) is at least 0.01 mbar at 20° C.

3. A method as claimed in claim 2, characterized in that monoalkyl cyclopentadienyl indium (I) is used, the number of carbon atoms of the alkyl group being maximally 4.

4. A method as claimed in claim 2, characterized in that methyl cyclopentadienyl indium (I) is used.

* * * * *